United States Patent
Sekimoto et al.

(10) Patent No.: US 8,232,469 B2
(45) Date of Patent: Jul. 31, 2012

(54) SOLAR BATTERY MODULE AND FORMING METHOD THEREOF

(75) Inventors: Takeyuki Sekimoto, Anpachi-gun (JP); Toshio Yagiura, Kobe (JP)

(73) Assignee: Sanyo Electric Co., Ltd., Osaka (JP)

( * ) Notice: Subject to any disclaimer, the term of this patent is extended or adjusted under 35 U.S.C. 154(b) by 323 days.

(21) Appl. No.: 12/723,182

(22) Filed: Mar. 12, 2010

(65) Prior Publication Data
US 2010/0307578 A1    Dec. 9, 2010

(30) Foreign Application Priority Data

Jun. 4, 2009   (JP) .................. 2009-135402

(51) Int. Cl.
  *H02N 6/00*   (2006.01)
  *H01L 31/00*   (2006.01)
  *H01L 31/042*   (2006.01)

(52) U.S. Cl. .................. 136/251; 136/256; 136/263

(58) Field of Classification Search ............... 136/251, 136/256, 263
See application file for complete search history.

(56) References Cited

U.S. PATENT DOCUMENTS
6,335,479 B1 *  1/2002  Yamada et al. ............... 136/251

FOREIGN PATENT DOCUMENTS
JP   3-116978 A   5/1991
JP   2007-165773 A   6/2007

* cited by examiner

*Primary Examiner* — Nathan M Nutter
(74) *Attorney, Agent, or Firm* — Ditthavong Mori & Steiner, P.C.

(57) ABSTRACT

A solar battery module comprises a substrate over a surface of which a solar battery unit is formed, and a resin structure which contacts the substrate and which covers a part of a side surface and a back surface of the substrate. The resin structure comprises a resin and a buffer material having a lower thermal expansion coefficient than the resin, and a mixture ratio of the buffer material with respect to the resin is reduced as a distance from the substrate is increased.

10 Claims, 3 Drawing Sheets

100

SOLAR BATTERY MODULE AND FORMING METHOD THEREOF

CROSS-REFERENCE TO RELATED APPLICATIONS

The entire disclosure of Japanese Patent Application No. 2009-135402 filed on Jun. 4, 2009, including specification, claims, drawings, and abstract, is incorporated herein by reference in its entirety.

BACKGROUND

1. Technical Field

The present invention relates to a solar battery module and a method of forming a solar battery module.

2. Related Art

Recently, power generation systems which use natural energy have attracted much attention. For example, a solar battery which enables power generation by solar light has attracted attention.

In general, a solar battery system comprises a solar battery module 100 as shown in FIG. 6. The solar battery module 100 comprises a glass substrate 100 over a surface of which a solar battery unit 12 is formed, a filler 14 formed of a resin and provided for protecting the solar battery unit, a back sheet 16, a metal frame 18 which structurally supports the module, and a rubber frame 20 provided for protecting an end when the glass substrate 10 or the like is supported by the metal frame 18. In addition, a line cable 22 extends from the solar battery unit 12.

As described above, in a thin film solar battery in which a thin film of a solar battery unit comprising an amorphous silicon thin film or a microcrystalline silicon thin film is formed over a glass substrate or the like over which a transparent electrode film is formed, because the glass cannot be thermally reinforced, as the size of the solar battery module is increased, the structure is structurally supported by a metal frame in order to improve the load tolerance strength. This structure, however, has caused an increase in the manufacturing cost.

SUMMARY

According to one aspect of the present invention, there is provided a solar battery module comprising a glass substrate over a surface of which a photoelectric conversion film is formed, and a resin structure which contacts the glass substrate and which covers a part of a side surface and a back surface of the glass substrate, wherein the resin structure comprises a resin and a buffer material having a lower thermal expansion coefficient than the resin, and a mixture ratio of the buffer material with respect to the resin is reduced as a distance from the glass substrate is increased.

BRIEF DESCRIPTION OF THE DRAWINGS

Preferred embodiments of the present invention will be described in further detail based on the following drawings, wherein.

DETAILED DESCRIPTION

Structure of Solar Battery Module

Figure 1:
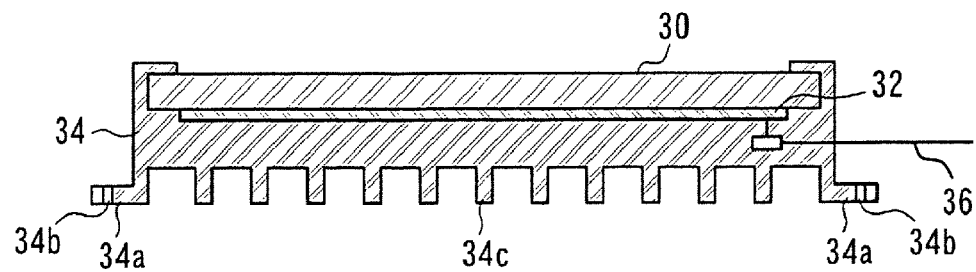
FIG. 1 is a diagram showing a structure of a solar battery module in a preferred embodiment of the present invention.

As shown in FIG. 1, a solar battery module 200 in a preferred embodiment of the present invention comprises a substrate 30, a solar battery unit 32, a resin structure 34, and an output cable 36. FIG. 1 is a schematic diagram showing a cross sectional structure of the solar battery module 200, and, in order to clarify the explanation, the elements are drawn with the ratios of sizes or the like different from the actual structure.

The substrate 30 functions as a light receiving surface of the solar battery module 200, and a light-transmissive material which allows light of a wavelength band used for the power generation in the solar battery unit 32 to be transmitted. In the present embodiment, glass is used for the substrate 30. A transparent conductive film (or TCO; Transparent Conductive Oxide) is formed on a back surface of the substrate 30.

The solar battery unit 32 is formed over the transparent conductive film formed over the substrate 30. The solar battery unit 32 is formed by sequentially layering the transparent conductive film, a semiconductor layer, and a back surface electrode while applying laser patterning. The solar battery unit 32 may be an integrated solar battery comprising a plurality of solar battery cells electrically connected to each other in series or in parallel.

The solar battery unit 32 may be, for example, an amorphous silicon semiconductor layer, a layered structure of a microcrystalline silicon semiconductor layer, or a combination of these. Alternatively, the solar battery unit 32 may be a compound semiconductor such as gallium arsenide. Aside near the substrate 30 is a side of a light receiving surface of the solar battery unit 32 and a side opposite from the substrate 30 is a back surface of the solar battery unit 32.

Figure 2:
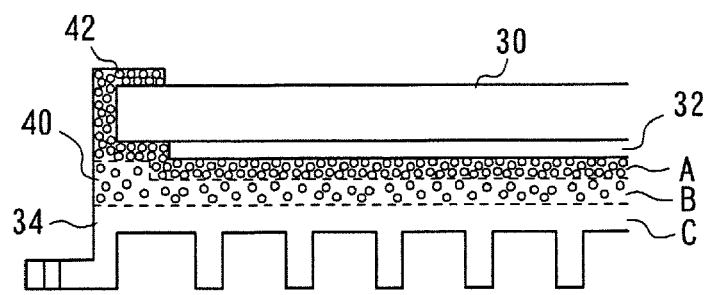
FIG. 2 is a schematic diagram showing an internal structure of a resin structure in a preferred embodiment of the present invention.

The resin structure 34 functions as a housing which supports the substrate 30 and the solar battery unit 32 as the solar battery module 200. As shown in FIG. 2, the resin structure 34 comprises a resin 40 and a buffer material 42 mixed to the resin 40.

The resin structure 34 in the present embodiment is formed to cover at least a part of a back surface side of the solar battery unit 32 and at least a part of a side surface and a front surface of the substrate 30. The resin structure 34 is formed over from the back surface of the solar battery unit 32 to the side surface of the substrate 30.

The resin structure 34 may comprise a leg portion 34a. A hole 34b to which a bolt for fixing the solar battery module 200 to a placement location is mounted is formed in the leg portion 34a. In addition, a plurality of rib structures 34c may be provided on the back surface of the resin structure 34, for improving the strength of the solar battery module 200. Preferably, a plurality of the rib structures 34c are provided in an aligned manner over the entire length of the solar battery module 200. The leg portion 34a and the rib structure 34c may also be integrally formed with the resin structure 34 using a molding frame corresponding to the leg portion 34a and the rib structure 34c.

The resin 40 is a material for forming the resin structure 34 as a structure. Characteristics desired for the resin 40 include: (1) a high climate durability (a durability of 30 years or greater when the solar battery module 200 is used outside); (2) a structural strength (such that the substrate 30 (glass) is not broken by application of a pressure of 2400 Pa on the solar battery module 200); (3) a superior machining characteristic (such that the substrate 30 and the solar battery unit 32 can be integrally molded); (4) a low machining temperature (such that the structure can be machined in a temperature region of less than or equal to 200° C. which does not cause a characteristic reduction of the solar battery unit 32); (5) a low specific gravity (such that the weight of the solar battery module 200 can be reduced); and (6) low material cost (a material cost suitable for mass production of the solar battery module 200). As the resin 40 satisfying these conditions, a material including at least one of a phenol resin, an epoxy resin, a melanin resin, a thermosetting polyimide, polyurethane, unsaturated polyester, an alkyd resin, a urea resin, and an olefin resin may be preferably used.

The buffer material 42 is mixed with the resin 40 in order to reduce a difference in thermal expansion coefficient between the resin structure 34 and the substrate 30, and to prevent flexure or breakdown of the substrate 30 and the solar battery unit 32 when the substrate 30 is supported by the resin structure 34. The buffer material 42 is a material having a thermal expansion coefficient less than that of the resin 40. As the buffer material 42, for example, a ceramic powder such as silicon oxide (SiOx) may be preferably used. A particle size of the buffer material 42 is preferably set to greater than or equal to 10 μm and less than or equal to 500 μm. The buffer material 42 is preferably formed in the shape of an approximate sphere, in order to reduce a contact area between the substrate 30 and the resin 40 and inhibit reduction of joining characteristic between the resin structure 34 and the substrate 30.

The resin structure 34 can be integrally formed by placing the substrate 30 over which the solar battery unit 32 is formed in a molding frame of a predetermined shape, pouring the resin with which the buffer material is mixed, and curing the resin. Because of this, the substrate 30 and the solar battery unit 32 are sealed by the resin structure 34 without the use of other structural members (such as a metal frame). The formation method of the resin structure 34 will be described later.

Here, in order to prevent a significant disadvantage of the solar battery module 200, the thermal expansion coefficient of the resin structure 34 near the boundary surface between the substrate 30 and the resin structure 34 is preferably set to greater than or equal to 80% and less than or equal to 200% of the thermal expansion coefficient of the substrate 30. The buffer material 42 does not need to be limited to the same size, and buffer materials 42 of different sizes may be used. With such a configuration, when the shape of the buffer material 42 is an approximate sphere, the mixture ratio of the buffer material 42 in the resin structure 34 can be increased, and a desired mixture ratio can be achieved. On the other hand, a stress by the resin structure 34 is gradually alleviated as the distance from the substrate 30 is increased. In addition, when the buffer material 42 is uniformly mixed over the entirety of the resin structure 34, the amount of usage of the buffer material 42 is increased, the structural strength of the solar battery module 200 is reduced, and the manufacturing cost is increased. Therefore, as shown in FIG. 2, the distribution of the buffer material 42 in the resin 40 in the resin structure 34 is preferably set such that the mixture ratio of the buffer material 42 with respect to the resin 40 is reduced as the distance from the substrate 30 is increased.

For example, the thermal expansion coefficient of glass which is primarily used as the substrate 30 is approximately $9 \times 10^{-6}$/K, the thermal expansion coefficient of the resin 40 is approximately $50 \times 10^{-6}$/K~$100 \times 10^{-6}$/K, and the thermal expansion coefficient of silicon oxide ($SiO_2$) which is primarily used as the buffer material 42 is approximately $0.5 \times 10^{-6}$/K. In this case, the mixture ratio of the buffer material 42 with respect to the resin 40 around a boundary surface between the substrate 30 and the resin structure 34 is preferably set to greater than or equal to 64%, more preferably, approximately 88%, and the mixture ratio of the buffer material 42 is reduced as the distance from the substrate 30 is increased. With such a configuration, the thermal expansion coefficients of the substrate 30 and the resin structure 34 are approximately equal to each other around the boundary surface between the substrate 30 and the resin structure 34, and the influence dude to the resin structure 34, such as flexure of the substrate 30 and the solar battery unit 32, does not tend to occur. In addition, at positions distant from the substrate 30, wasteful use of the buffer material 42 can be prevented.

Figure 3:
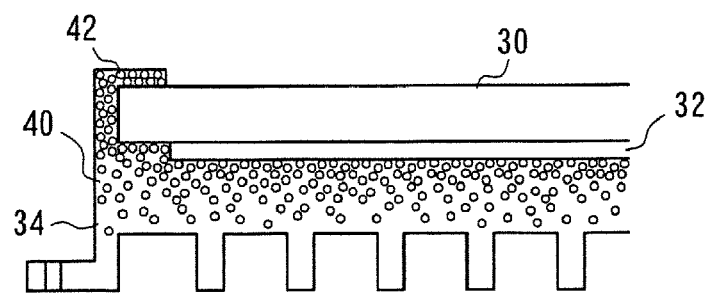
FIG. 3 is a schematic diagram showing an internal structure of a resin structure in a preferred embodiment of the present invention.

The resin structure 34 may have a structure as shown in FIG. 2 in which a plurality of layers A~C having different mixture ratios of the buffer material 42 with respect to the resin 40 are layered and the mixture ratio is stepwise reduced as the distance from the substrate 30 is increased, or the resin structure 34 may have a structure as shown in FIG. 3 in which the mixture ratio of the buffer material 42 with respect to the resin 40 is continuously reduced.

The output cable 36 is a cable for sending the electric power generated by the solar battery unit 32 to external devices. The output cable 36 comprises a conductive core line and an insulating coating covering the core line. The output cable 36 is embedded in the resin structure 34, one end of the output cable 36 is soldered to a terminal provided on the solar battery unit 32, the other end of the output cable 36 is extended to the outside of the resin structure 34, and a connection terminal is mounted for connection with the external device.

<Manufacturing Method of Solar Battery Module>

A manufacturing method of the solar battery module 200 in a preferred embodiment of the present invention will now be described with reference to FIGS. 4 and 5.

Figure 4A:
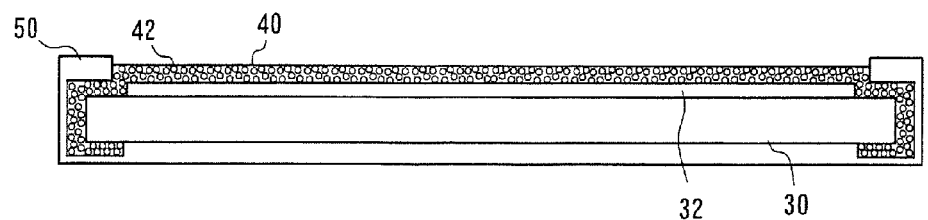
FIGS. 4A-4C are diagrams showing manufacturing steps of a solar battery module in a preferred embodiment of the present invention.
Figure 4B:
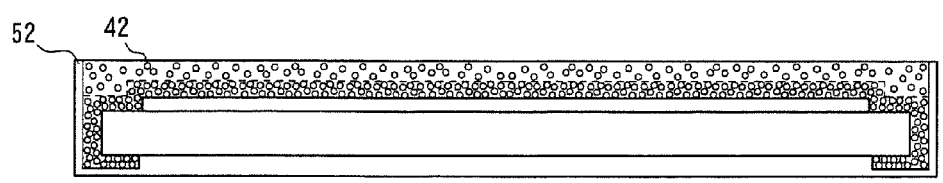
Figure 4C:
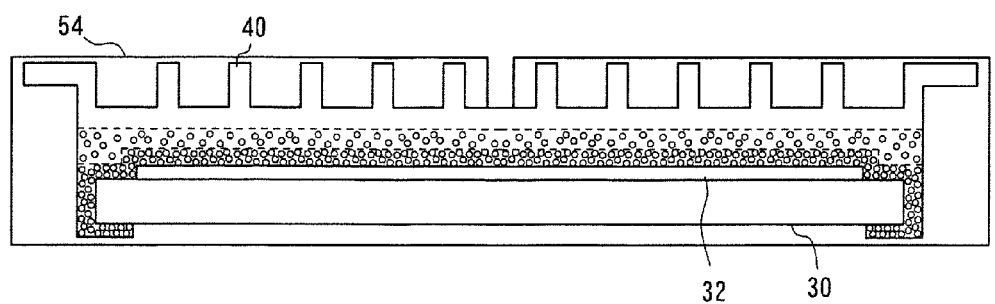

FIGS. 4A~4C show steps of forming the resin structure 34 by layering a plurality of layers having different mixture ratios of the buffer material 42 with respect to the resin 40.

In step S10, as shown in FIG. 4A, the substrate 30 over which the solar battery unit 32 is formed is placed within a molding frame 50, and the resin 40 to which the buffer material 42 is mixed is poured and cured. The modeling frame 50 preferably has a shape such that the resin 40 and the buffer material 42 cover at least a part of a back surface side of the solar battery unit 32 and at least a part of a side surface and a front surface of the substrate 30. If the resin 40 is a thermosetting resin, for example, the resin 40 can be cured by heating at a temperature of approximately 150° C. With this process, a layer A is formed.

In step S12, as shown in FIG. 4B, the substrate 30 over which the layer A is formed in step S10 is placed in a molding frame 52 having a larger size than the molding frame 50, and the resin 40 with which the buffer material 42 is mixed is poured and cured. The mixture ratio of the buffer material 42 with respect to the resin 40 to be poured is set smaller than that in step S10. With this process, a layer B having a smaller mixture ratio of the buffer material 42 with respect to the resin 40 than that of the layer A is formed around the layer A.

In step S14, as shown in FIG. 4C, the substrate 30 over which the layer B is formed in step S12 is placed in a molding frame 54 having a larger size than the molding frame 52, and the resin 40 with which the buffer material 42 is mixed is poured and cured. The mixture ratio of the buffer material 42 with respect to the resin 40 to be poured is set smaller than that in step S12. With this process, a layer C having a smaller mixture ratio of the buffer material 42 with respect to the resin 40 than that of the layer B is formed around the layer B.

In this manner, the resin structure 34 can be formed as shown in FIG. 2 wherein the layers A~C are layered such that the mixture ratio of the buffer material 42 with respect to the resin 40 is stepwise reduced as the distance from the substrate 30 is increased.

For example, if the substrate 30 is glass, the thermal expansion coefficient of the resin 40 is $70 \times 10^{-6}$/K, and the thermal expansion coefficient of the buffer material 42 is $0.5 \times 10^{-6}$/K, the mixture ratio of the buffer material 42 with respect to the resin 40 in the layer A is preferably greater than or equal to 64%, more preferably, approximately 88%, and the mixture ratio of the buffer material 42 is reduced as the distance from the substrate 30 is increased. For example, the mixture ratio of the buffer material 42 with respect to the resin 40 in the layer C is set to 0, and the mixture ratio of the buffer material 42 with respect to the resin 40 in the layer B is set to a value between 64% and 0, more preferably, between 88% and 0.

In the present embodiment, the resin structure 34 has three layers, but the present invention is not limited to such a configuration, and the number of layers may be 2, or 4 or more. In addition, when the leg portion 34a or the rib structure 34c is to be provided in the resin structure 34, a molding frame having a shape corresponding to the leg portion 34a or the rib structure 34c may be used. In order to disperse the buffer material 42 within the resin 40, ultrasound or vibration may be applied to at least one of the molding frames 52 to 54 when the resin structure 34 is formed.

Figure 5A:
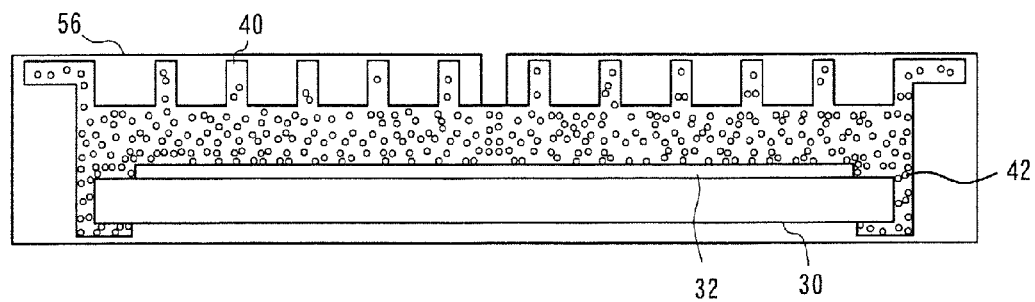
FIGS. 5A and 5B are diagrams showing manufacturing steps of a solar battery module in a preferred embodiment of the present invention.
Figure 5B:
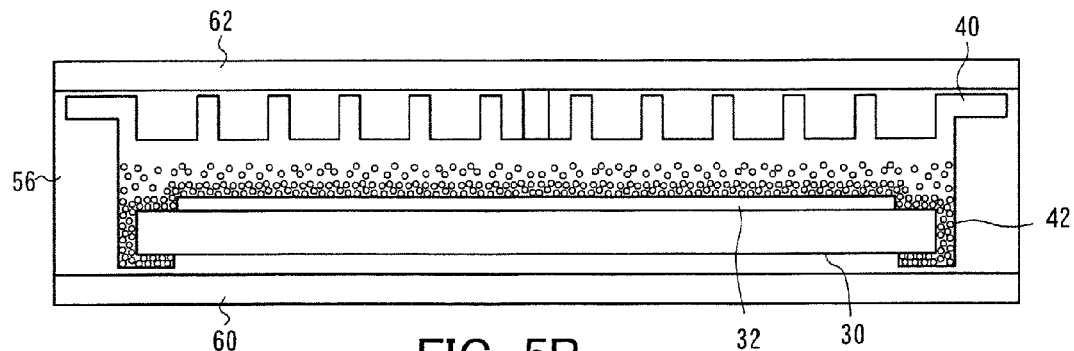
Figure 6:
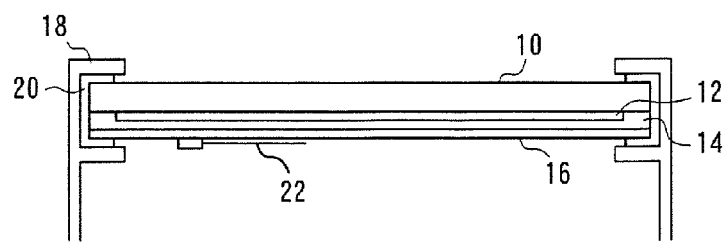
FIG. 6 is a diagram showing a structure of a solar battery module in related art.

FIGS. 5A and 5B show steps for forming the resin structure 34 wherein the mixture ratio of the buffer material 42 with respect to the resin 40 is continuously reduced as the distance from the substrate 30 is increased.

In step S20, as shown in FIG. 5A, the substrate 30 over which the solar battery unit 32 is formed is placed in a molding frame 56, and the resin 40 with which the buffer material 42 is mixed is poured. The molding frame 56 preferably has a shape such that the resin 40 and the buffer material 42 cover at least a part of the back surface side of the solar battery unit 32 and at least a part of the side surface and the front surface of the substrate 30. In addition, when the leg portion 34a or the rib structure 34c is to be provided in the resin structure 34, the molding frame 56 may have a shape corresponding to the leg portion 34a or the rib structure 34c.

In step S22, as shown in FIG. 5B, the structure is heated such that the temperature is higher as the distance from the substrate 30 is increased, to cure the resin 40 and form the resin structure 34. For example, as shown in FIG. 5B, a region near the substrate 30 is heated to a temperature of approximately 20° C.~50° C. with a heater 60, and a position more distant from the substrate 30 is heated to a temperature of approximately 90° C. with a heater 62. With this structure, the buffer material 42 is thermally diffused in the resin 40, and the buffer material 42 is re-distributed such that the mixture ratio of the buffer material 42 with respect to the resin 40 is continuously reduced as the distance from the substrate 30 is increased.

In this manner, the resin structure 34 can be formed such that the mixture ratio of the buffer material 42 with respect to the resin 40 is continuously reduced as the distance from the substrate 30 is increased. By adjusting the mixture ratio between the resin 40 and the buffer material 42 and the heating condition or the like, for example, the mixture ratio of the buffer material 42 with respect to the resin 40 near the substrate 30 may be set to greater than or equal to 64%, more preferably, 88%, and the mixture ratio of the buffer material 42 with respect to the resin 40 at a position more distant from the substrate 30 may be set to less than or equal to 64%, more preferably, less than 88%.

What is claimed is:

1. A solar battery module, comprising:
    a glass substrate over a surface of which a photoelectric conversion film is formed; and
    a resin structure which contacts the glass substrate and which covers a part of a side surface and a back surface of the glass substrate; wherein
    the resin structure comprises a resin and a buffer material having a lower thermal expansion coefficient than the resin, and a mixture ratio of the buffer material with respect to the resin is reduced as a distance from the glass substrate is increased.

2. The solar battery module according to claim 1, wherein in the resin structure, the mixture ratio of the buffer material with respect to the resin is stepwise reduced as the distance from the glass substrate is increased.

3. The solar battery module according to claim 1, wherein in the resin structure, the mixture ratio of the buffer material with respect to the resin is continuously reduced as the distance from the glass substrate is increased.

4. The solar battery module according to claim 1, wherein the glass substrate has strength such that the glass substrate is not broken with application of a pressure of 2400 Pa.

5. The solar battery module according to claim 4, wherein the resin includes at least one of a phenol resin, an epoxy resin, a melanin resin, a thermosetting polyimide, polyurethane, unsaturated polyester, an alkyd resin, a urea resin, and an olefin resin.

6. The solar battery module according to claim 1, wherein the buffer material comprises silicon oxide.

7. The solar battery module according to claim 6, wherein in the resin structure, the mixture ratio of the buffer material with respect to the resin in a region contacting the glass substrate is greater than or equal to 64%.

8. The solar battery module according to claim 1, wherein the buffer material has a shape of an approximate sphere.

9. A method of forming a solar battery module, comprising:
    a first step in which a substrate over a surface of which a photoelectric conversion film is formed is covered by a mixture material of a resin and a buffer material having a lower thermal expansion coefficient than the resin, and the mixture material is cured, to form a first resin structure; and
    a second step in which at least a part of the first resin structure is covered by a mixture material of the resin and the buffer material wherein a mixture ratio of the buffer material with respect to the resin is lower than that in the first step, and the mixture material is cured, to form a second resin structure, wherein
    a resin structure is formed including the first resin structure and the second resin structure covering a part of a side surface and a back surface of the glass substrate.

10. A method of forming a solar battery module, comprising:
    covering a glass substrate over a surface of which a photoelectric conversion film is formed, by a mixture material of a resin and a buffer material having a lower thermal expansion coefficient than the resin, and heating in a manner such that a temperature becomes higher as a distance from the glass substrate is increased, to cure the resin; and
    forming a resin structure such that a mixture ratio of the buffer material with respect to the resin is reduced as the distance from the glass substrate is increased.

* * * * *